United States Patent
Hsieh et al.

(10) Patent No.: US 8,094,493 B2
(45) Date of Patent: Jan. 10, 2012

(54) MEMORY DEVICES AND METHODS USING IMPROVED REFERENCE CELL TRIMMING ALGORITHMS FOR ACCURATE READ OPERATION WINDOW CONTROL

(75) Inventors: Wen-Yi Hsieh, Tainan (TW); Ken-Hui Chen, Taichung (TW); Chun-Hsiung Hung, Tainan (TW); Han-Sung Chen, Giron (TW); Nai-Ping Kuo, Tainan (TW); Ching-Chung Lin, Taipei (TW); Chuan-Ying Yu, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/271,300

(22) Filed: Nov. 10, 2005

(65) Prior Publication Data

US 2006/0104113 A1      May 18, 2006

Related U.S. Application Data

(60) Provisional application No. 60/627,087, filed on Nov. 12, 2004.

(51) Int. Cl.
*G11C 11/34* (2006.01)
*G11C 7/02* (2006.01)

(52) U.S. Cl. ......... 365/185.03; 365/185.18; 365/185.2; 365/185.21; 365/185.22; 365/185.24; 365/210

(58) Field of Classification Search ............ 365/185.03, 365/185.18, 185.2, 185.21, 185.22, 185.24, 365/210

See application file for complete search history.

(56) References Cited

U.S. PATENT DOCUMENTS

| | | | | |
|---|---|---|---|---|
| 5,142,495 A | * | 8/1992 | Canepa | 365/185.2 |
| 5,933,366 A | * | 8/1999 | Yoshikawa | 365/185.03 |
| 5,966,330 A | * | 10/1999 | Tang et al. | 365/185.2 |
| 6,118,701 A | * | 9/2000 | Uekubo | 365/185.2 |
| 6,215,697 B1 | * | 4/2001 | Lu et al. | 365/185.03 |
| 6,370,060 B2 | * | 4/2002 | Takata et al. | 365/185.21 |
| 6,370,061 B1 | * | 4/2002 | Yachareni et al. | 365/185.22 |

(Continued)

FOREIGN PATENT DOCUMENTS

CN    1288236    3/2001

OTHER PUBLICATIONS

"First Office Action of China Counterpart Application", issued on Dec. 7, 2007, p. 1-p. 8, in which the listed reference was cited.

*Primary Examiner* — Trong Phan

(74) *Attorney, Agent, or Firm* — Jianq Chyun IP Office

(57) ABSTRACT

A memory device is disclosed that includes a plurality of word lines and a plurality of memory cells operating in one of a plurality of modes and coupled to at least one of the word lines. The memory device also includes a plurality of reference lines and reference cells. Each reference cell corresponds to one of the operating modes, supplies a reference current for the corresponding mode, and is coupled to at least one of the reference lines. A reference cell current from a reference cell can also be compared to a target range and, if outside the target range, the voltage level on a corresponding reference line can be adjusted accordingly such that the reference current falls within the target range (i.e., reference current trimming).

4 Claims, 10 Drawing Sheets

U.S. PATENT DOCUMENTS

| | | | |
|---|---|---|---|
| 6,650,570 B2 * | 11/2003 | Tanzawa et al. | 365/185.2 |
| 6,735,120 B2 * | 5/2004 | Homma et al. | 365/185.2 |
| 6,760,253 B2 * | 7/2004 | Kamei | 365/185.2 |
| 6,775,186 B1 * | 8/2004 | Eshel | 365/185.21 |
| 6,795,350 B2 * | 9/2004 | Chen et al. | 365/185.2 |
| 6,839,280 B1 * | 1/2005 | Chindalore et al. | 365/185.2 |
| 6,888,757 B2 * | 5/2005 | Lusky et al. | 365/185.2 |
| 7,038,948 B2 * | 5/2006 | Hamilton et al. | 365/185.18 |
| 7,113,429 B2 * | 9/2006 | Forbes | 365/185.18 |
| 7,120,060 B2 * | 10/2006 | Pekny | 365/185.2 |
| 7,164,604 B2 * | 1/2007 | Arakawa | 365/185.21 |
| 7,170,789 B2 * | 1/2007 | Iwata et al. | 365/185.2 |
| 7,180,782 B2 * | 2/2007 | Yu et al. | 365/185.21 |
| 7,206,241 B2 * | 4/2007 | Kido et al. | 365/185.2 |
| 7,262,999 B2 * | 8/2007 | Shen et al. | 365/185.2 |
| 7,289,368 B2 * | 10/2007 | Del Gatto et al. | 365/185.2 |

* cited by examiner

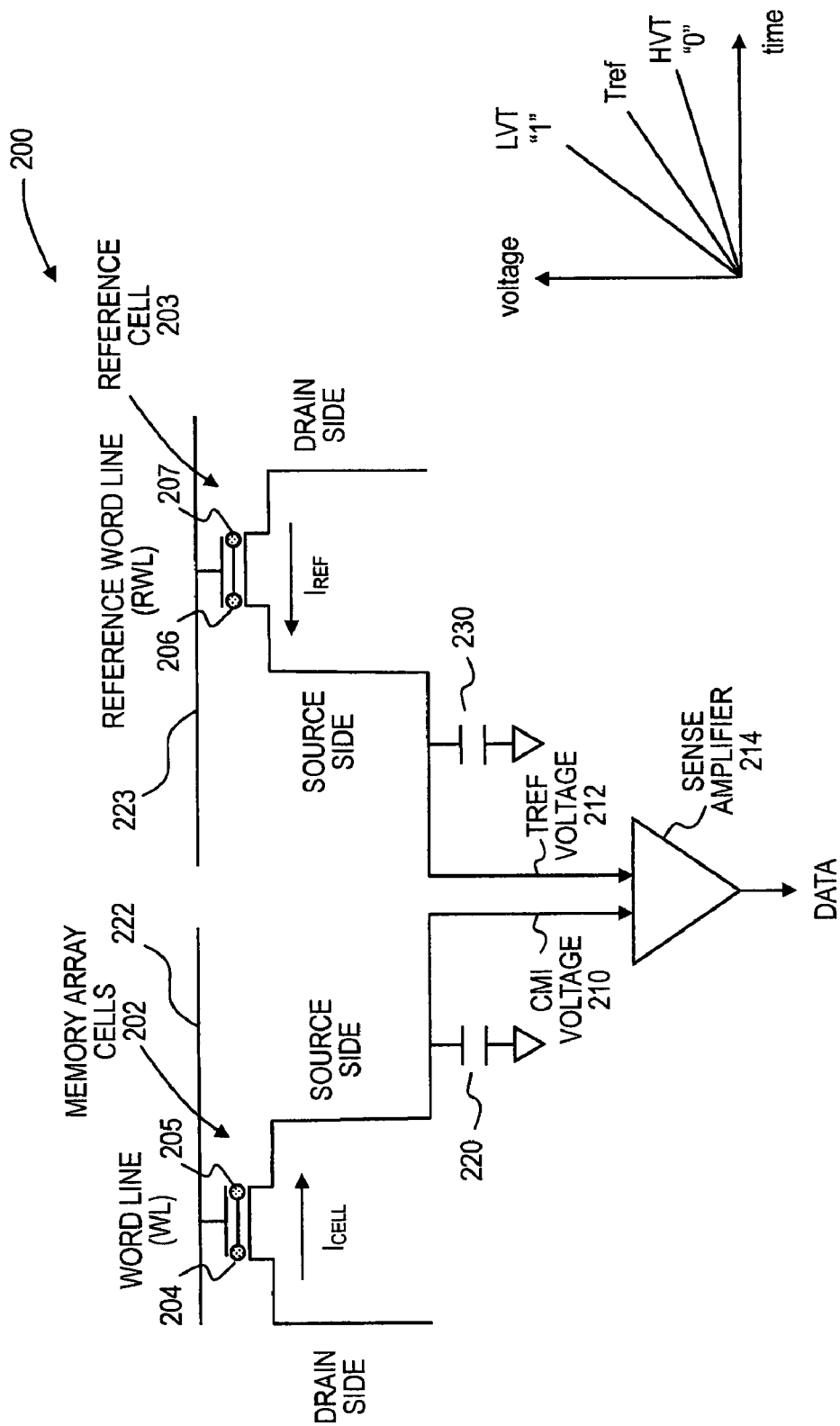

MEMORY DEVICES AND METHODS USING IMPROVED REFERENCE CELL TRIMMING ALGORITHMS FOR ACCURATE READ OPERATION WINDOW CONTROL

RELATED APPLICATION

This application claims priority to U.S. Provisional Application No. 60/627,087, entitled "MEMORY DEVICE AND METHODS USING IMPROVED REFERENCE CELL TRIMMING ALGORITHMS FOR ACCURATE READ OPERATION WINDOW CONTROL," filed on Nov. 12, 2004, which is hereby incorporated herein by reference.

FIELD

This present invention relates generally to non-volatile memory devices and, more particularly, to memory devices and methods using improved reference cell trimming algorithm for accurate read operation window control.

BACKGROUND

Memory devices typically include an array of memory cells that use transistors to store logic states: a logic "1" or "0." A reference cell can be used to read or verify the proper logic states stored in the memory cells. For instance, the output voltage of a memory cell can be compared with the output voltage of the reference cell and, depending on the comparison of the voltages, one of the stored logic states can thus be determined. In addition, when a memory cell is programmed or erased, the output voltage or signal it generates can differ from the reference voltage by some margin. Thus, generating an accurate reference current (used for generating the reference voltage) is also important in determining that the correct logic state is stored in the memory cells and read at a proper speed.

Over time, memory cells may experience continual erasing and programming that can cause variations of the threshold voltages on the individual memory cells. The threshold voltages determine whether a memory cell properly stores a logic "1" or a "0." Moreover, the process variations in making a memory device can also induce initial threshold voltage $V_T$ differences as well. Prior methods for generating a reference voltage or signal have been deficient in dealing with initial threshold voltage $V_T$ variations. For example, FIG. 1A illustrates a prior art reference cell 103 with memory array cells 103. The reference cell 103 can provide a constant reference current (used for generating the reference voltage) by adjusting DC voltage levels on the reference word line (RWL) 123. This reference voltage can be compared with the output voltages of the memory array cells 102 to determine the stored logic state in memory array cells 102. The following table shows the voltage levels used on the word line 122 for memory array cells 102 and reference word line 123 for reference cell 103 during different read modes for the prior scheme.

| READ MODES | WL VOLTAGES | RWL VOLTAGES |
| --- | --- | --- |
| User Read mode | AVX (4.1 V) | RAVX (DC Bias) |
| Program Verify Mode | AVX (5.2 V) | RAVX (DC Bias) |
| Erase Verify Mode | AVX (3.4 V) | RAVX (DC Bias) |
| Other Read/Verify Modes | AVX | RAVX (DC Bias) |

Referring to the above table, the prior art scheme did not account for initial threshold voltage $V_T$ variations. For instance, to adjust the voltage level on the reference word line 123, the reference cell 103 is maintained at an initial state and does not operate in a programmed or erased state. Thus, all read, program verify, and erase verify modes share the same reference cell 103. By using the same reference cell in this prior scheme, the voltage levels applied to the WL 122 and RWL 123 are different (i.e., non-tracking of the WL/RWL voltage levels). In this manner, the memory array cells 102 and reference cell 103 are activated with different voltage levels that can cause improper voltage levels to be compared with when reading a data bit in the memory array cells 103. As a result, read margin loss can occur if improper data is read from the memory array cells 103.

FIG. 1B illustrates graphically the effects of initial threshold voltage $V_T$ variations for the prior memory array cells of FIG. 1A. As shown, the read RD, erase verify EV, and program verify PV voltage levels are fixed. However, different memory devices can have different cycle margins due to varying initial threshold voltages $V_T$. The cycle margin (CM) can be dependent on the process variations and thus affect the reliability of the memory device. Hence, to obtain proper operation of a memory device and maintain superior data reliability and retention, the varying initial threshold voltages $V_T$ across the memory cells should be accommodated for when comparing with the reference voltage and reading the logic states stored in the memory cells. The erase margin (EM) is defined by the voltage difference between the RD voltage level and the erase verify EV voltage level. The program margin (PM) is defined by the voltage difference between the RD voltage level and the program verify PV voltage level.

Thus, what is needed is an improved memory device having reference cells providing reference voltages or signals that accommodate for varying initial threshold voltages $V_T$.

SUMMARY

According to one aspect of the invention, a memory device is disclosed that includes a plurality of word lines and a plurality of memory cells operating in one of a plurality of modes and coupled to at least one of the word lines. The memory device also includes a plurality of reference lines and reference cells. Each reference cell corresponds to one of the modes, supplies a reference current for the corresponding mode, and is coupled to at least one of the reference lines.

According to another aspect of the invention, a memory device method is disclosed in which a first reference cell in the memory device is selected. At least one data bit in the first reference cell is programmed. A reference current from the first reference cell is measured. A voltage level on a reference word line coupled to the first reference cell is adjusted if the measured reference current from the first reference cell falls outside of a target range.

According to another aspect of the invention, a memory device method is disclosed in which a reference cell is selected. A fist reference bit and a second reference bit in the selected reference cell is programmed. A reference current from the selected reference cell is measured. A voltage level on a reference word line coupled to the selected reference cell is adjusted if the measured reference current from the selected reference cell falls outside of a target range.

BRIEF DESCRIPTION OF THE DRAWINGS

The accompanying drawings, which are incorporated in and constitute part of this specification, illustrate examples and embodiments of the invention, and together with the description, serve to explain the principles of the invention. In the drawings.

FIG. 2A illustrates an exemplary memory device using a source sensing scheme;

FIG. 2B illustrates one exemplary voltage versus time graph in determining logic states of a data bit in a memory cell;

DETAILED DESCRIPTION

Figure 1A:
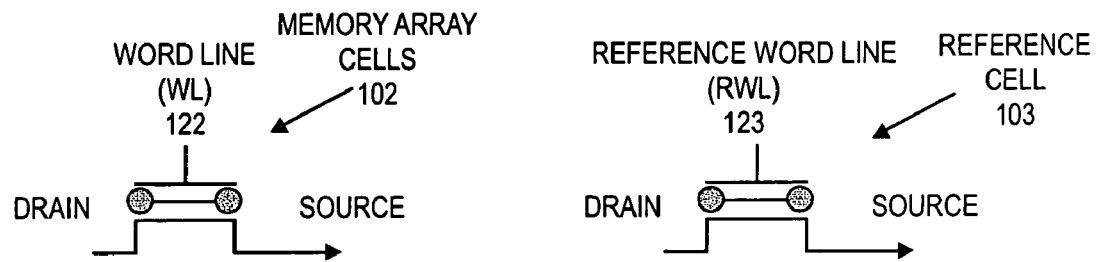
FIG. 1A illustrates a prior art reference cell providing a constant reference current by using an adjustable DC voltage to a reference word line.
Figure 1B:
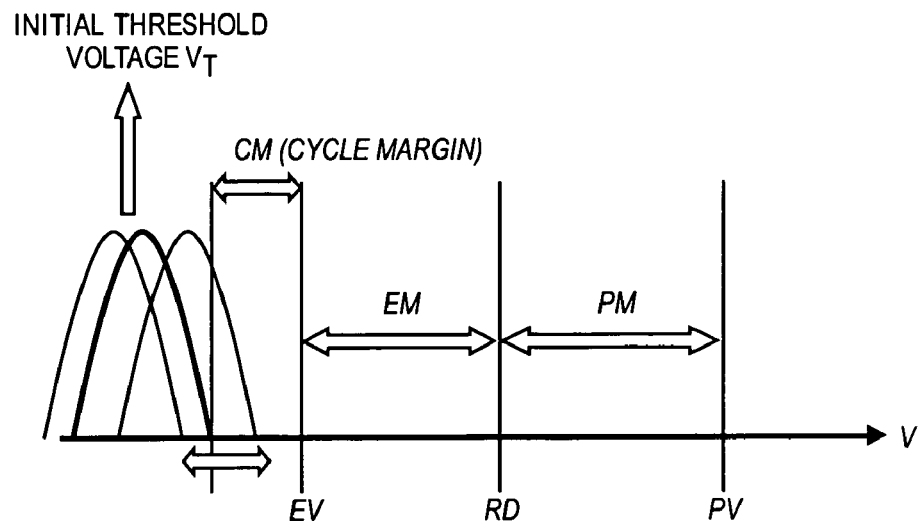
FIG. 1B illustrates graphically the effects of initial threshold voltage $V_T$ variations for the prior memory array cells of FIG. 1A.

Reference will now be made in detail to the exemplary embodiments of the invention, examples of which are illustrated in the accompanying drawings. Wherever possible, the same reference numbers will be used throughout the drawings to refer to the same. The following examples and methods cure deficiencies of prior techniques and can provide reference voltages or signals that accommodate for varying initial threshold voltages $V_T$ of memory cells.

According to one example, a memory device is disclosed that includes a plurality of word lines and a plurality of memory cells operating in one of a plurality of modes and coupled to at least one of the word lines. The memory device also includes a plurality of reference lines and reference cells. Each reference cell corresponds to one of the modes, supplies a reference current for the corresponding mode, and is coupled to at least one of the reference lines. In other examples, a reference cell current from a reference cell can also be compared to a target range and, if outside the target range, the voltage level on a corresponding reference line can be adjusted accordingly such that the reference current falls within the target range (i.e., reference current trimming).

By having a reference cell corresponding to one of the operating modes, a more stable operation condition for a memory device can be obtained such that each operating mode uses its own reference current. In addition, trimming the reference current so that it falls within a target range and accommodates for initial threshold $V_T$ variations across the memory cells. The following description details exemplary embodiments and methods for implementing reference current trimming.

FIG. 2A illustrates an exemplary memory device 200 using a source sensing scheme. In this example, memory device 200 is a nitride-read-only memory (NROM) device having a memory cell 202 and a reference cell 203. The memory cell 202 can store two bits of data (data bits 204, 205). For an NROM memory device, an oxide-nitride-oxide (ONO) layer is used as a charge trapping medium to store the bits. The following techniques, however, are not limited to NROM devices and can be implemented in other types of memory devices.

Referring to FIG. 2A, the memory cell 202 is coupled with a word line (WL) 222 and the reference cell 203 is coupled to a reference word line (RWL) 223. Both the memory cell 202 and reference cell 203 have drain and source sides. In this example, a source side sensing scheme is shown such that the current $I_{CELL}$ is converted by a current-voltage-converter 220 to generate a current sensing voltage (CMI) 210 at the source side of memory cell 202 and the reference current $I_{REF}$ is converted by a current-to-voltage converter 222 to generate a reference voltage $T_{REF}$ 212 at the source side of reference cell 203. The CMI and $T_{REF}$ voltages 210 and 212 are inputs to sense amplifier 214 that compares the voltages and determine the logic state of a data bit stored in memory cell 204. For example, as illustrated in FIG. 2B, this comparison can determine if the data stored as data bit 205 in memory cell 202 is at a high threshold voltage HVT logic "0" or low voltage threshold LVT logic "1." Thus, providing the proper reference current $I_{REF}$ (used for generating the reference voltage CMI 112) by the reference cell 103 is essential for the proper operation of the memory device 200. The reference current trimming methods described herein can be applied to program the reference cell 203 such that it outputs a constant reference current $I_{REF}$ which can accommodate for initial threshold voltage $V_T$ variations.

Figure 3:
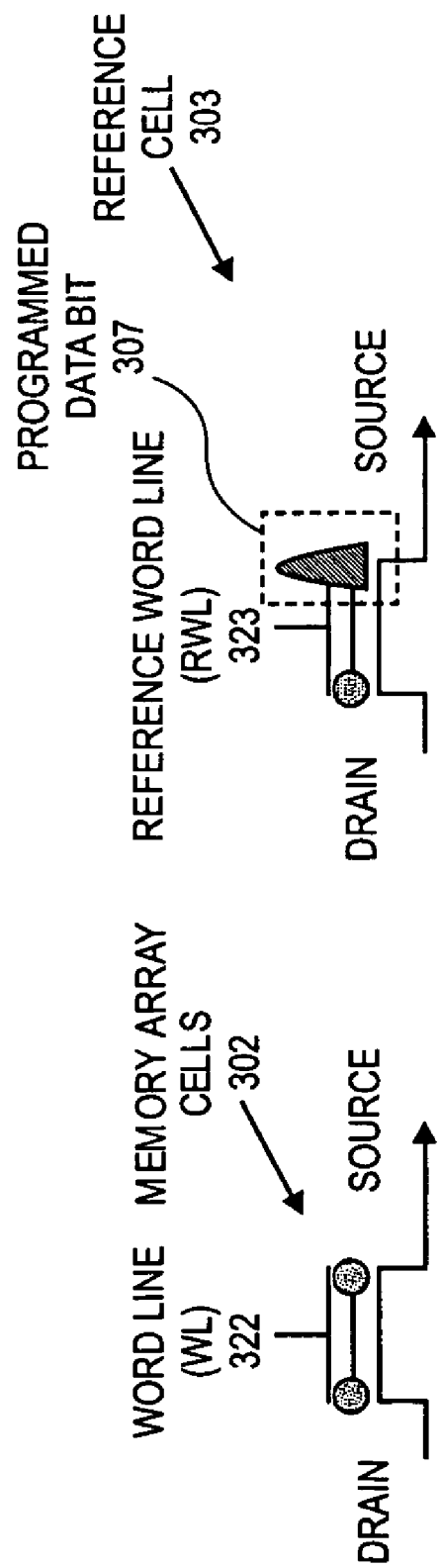
FIG. 3 illustrates an exemplary programmed reference cell for reference current trimming.
Figure 5:
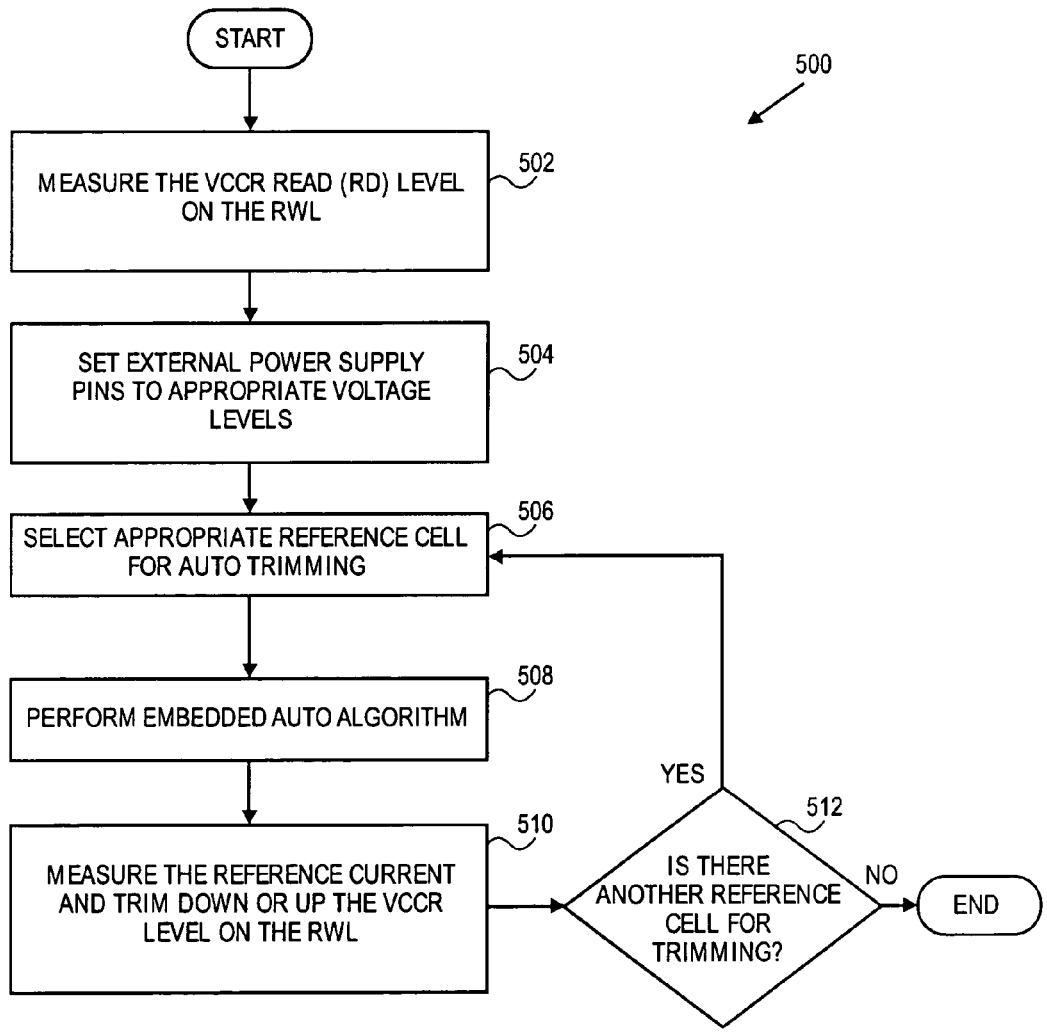
FIG. 5 illustrates an exemplary flow diagram of a reference current trimming algorithm that can be used for the examples of FIGS. 3 and 4A.

FIG. 3 illustrates an exemplary programmed reference cell 303 used for Reference current trimming that can provide a constant reference current for use by memory array cells 302. As shown, reference cell 303 can have a programmed reference bit 307. The programmed memory cell 303 can generate a constant reference current for all read/verify algorithms and operations that can account for variations in initial voltage $V_T$ thresholds. In one example, the reference trimming algorithm described in FIG. 5 is applied to the programmed reference cell 303 to generate a constant reference current. Using this method, the voltage threshold $V_t$ for the reference cell 303 is trimmed or adjusted to obtain a constant or nearly constant reference current. In the read, program verify, and erase verify modes, the memory array cells 302 can share the same reference cell 303. The following table shows the voltage levels used on the word line 322 and reference word line 323 for the programmed reference cell 303 during different read modes for the example of FIG. 3.

| READ MODES | WL VOLTAGES | RWL VOLTAGES |
| --- | --- | --- |
| User Read mode | AVX (4.1 V) | RAVX (4.1 V Bias) |
| Program Verify Mode | AVX (5.2 V) | RAVX (4.1 V Bias) |
| Erase Verify Mode | AVX (3.4 V) | RAVX (4.1 V Bias) |
| Other Read/Verify Modes | AVX | RAVX (4.1 V Bias) |

Figure 4A:
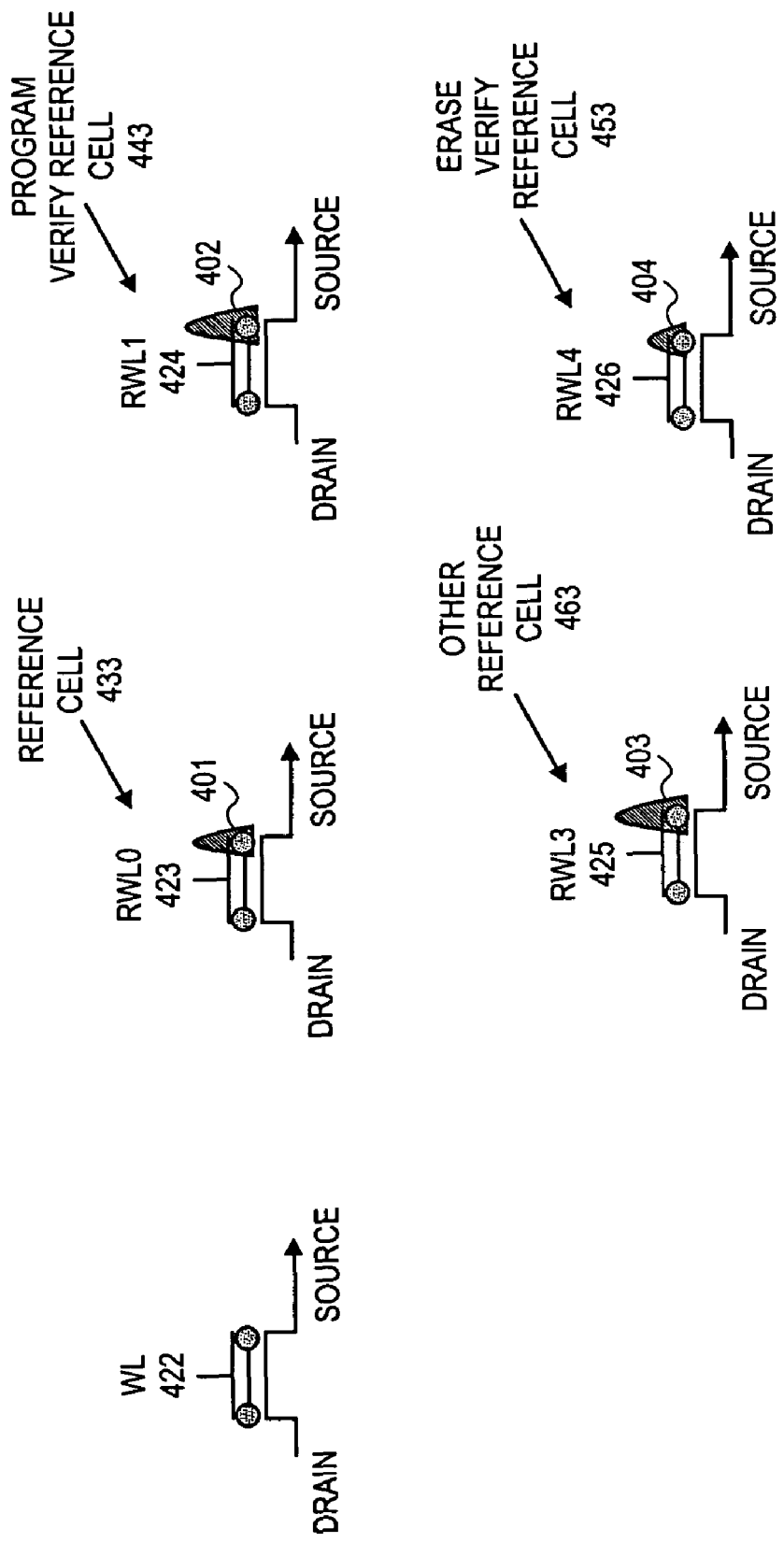
FIG. 4A illustrates exemplary reference cells for reference current trimming.

FIG. 4A illustrates exemplary reference cells 433, 443, 453, and 463 for different operating modes (read, program verify, erase verify, and other modes) used for reference current trimming. The reference cells have programmed reference bits 401, 402, 403, and 404. In contrast to the example of FIG. 3, this example includes a separate reference cell for each of the different operating modes and have reference word line (RWL) voltage levels equal to the word line (WL) voltage levels. This is illustrated, e.g., in the table below for FIG. 4A.

| Read Mode | WL | RWL0 | RWL1 | RWL2 | RWL3 |
|---|---|---|---|---|---|
| User Read | AVX (4.1 V) | AVX (4.1 V) | GND | GND | GND |
| Prgm Verify | AVX (5.2 V) | GND | AVX (5.2 V) | GND | GND |
| Erase Verify | AVX (3.4 V) | GND | GND | AVX (3.4 V) | GND |
| Other Mode | AVX | GND | GND | GND | AVX |

Thus, during any one of the operating modes, the corresponding reference cell for the operating mode will be used for the memory array cells 402. For example, in the read operating mode, the read reference cell 433 is selected and reference current used to generate the reference voltage that is compared with the output voltage from the memory array cells 402. As shown in the above table, the word line (WL) voltage level and the reference word line (RWL) voltage level are the same for each operating mode, i.e., the WL and RWL voltage levels track each other. This can be accomplished by sharing the same voltage source. By having WL/RWL voltage level tracking, read margin loss can be minimized under various voltage and temperature environments because the reference cells and memory array cells are activated using the same voltage level that provides for more stable voltage outputs. As a result, a constant window margin can be provided that automatically tracks the voltages applied to the memory cells with the reference cells, which can maintain stable initial threshold voltages $V_T$.

Figure 4C:
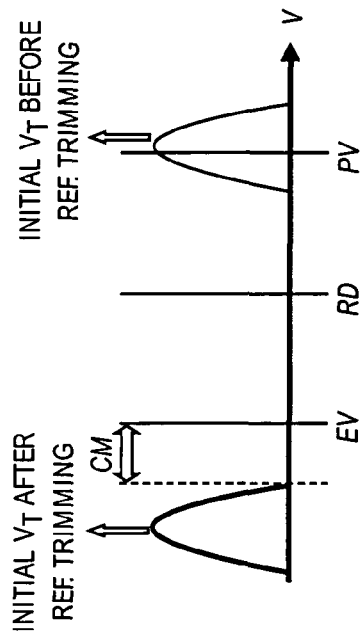
FIG. 4B-4D illustrate exemplary graphs that depict the effects of maintaining a stable initial threshold voltage $V_T$ for the memory cells of FIG. 4A.
Figure 4D:
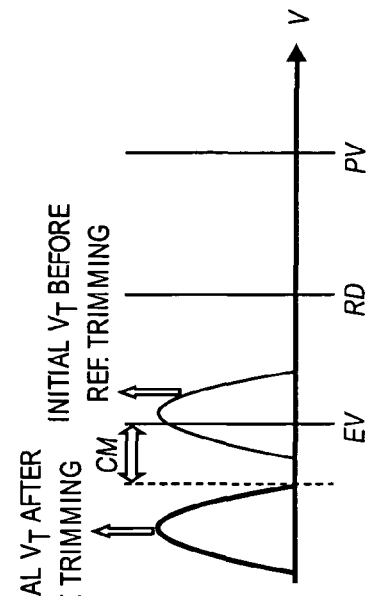
Figure 4B:
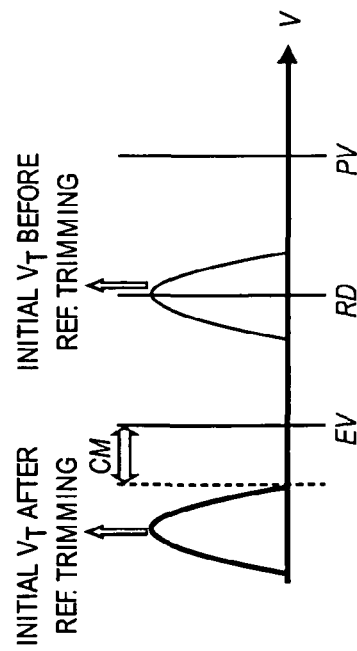

By using a separate reference cell with different RWL voltage levels for RLW0, RLW1, RLW2, and RLW3 for the read, program verify, erase verify, and other modes, the voltage level for WL can equal the RWL in the appropriate operating mode. In certain examples, each of the reference cells 433, 443, 453, and 463 can be programmed (RD/PV/EV) through a proposed trimming algorithm to obtain a constant cycle margin. The RWL voltage level can be adjusted such that each reference cell can output a constant reference cell current and obtain a constant window margin (i.e., initial LVT high boundary to erase LVT high boundary and program HVT low boundary to erase LVT high boundary). FIGS. 4B-4D illustrate exemplary graphs that depict the effect of maintaining a stable initial threshold voltage $V_T$ for the memory cells of FIG. 4A in the manner described above.

FIG. 5 illustrates an exemplary flow diagram of a reference current trimming algorithm that can be used in the examples of FIGS. 3 and 4A. Initially, the VCCR read (RD) level on the RWL is measured (step 502). This is the voltage level on the reference word line RWL for the reference during a normal read mode operation. The external power supply pins are then set to appropriate voltage levels (step 504). For example, a first external power supply pin (EXT_PWR1) can be set to a first voltage level, e.g., EXT_PWR1=VCCR Voltage−Erase Margin (EM) Voltage−Cycle Margin (CM) Voltage. The CM voltage is factored in for memory device reliability and the EM voltage factors in low voltage threshold LVT read margin. A second external power supply pin (EXT_PWR2) can be set to a second voltage level, e.g., EXT_PWR2=voltage range of 6V to 7.5V, the range can vary according to device characteristics. In other examples, the EXT_PWR2 voltage value can depend on experimental data to optimize reference cell program speed and stability.

The appropriate reference cell is then selected for auto trimming (step 506). For example, referring to the example of FIG. 4A, if the memory device includes separate reference cells for the different read operation modes (RF, PV, EV, or Other), then the appropriate reference cell is selected for auto trimming. If there is only one reference cell, e.g., referring to the example of FIG. 3, then it is selected for auto trimming. An embedded auto algorithm is then performed (step 508). This embedded auto algorithm is explained in FIG. 7 and is used to program the reference cell. The reference current $I_{ref}$ from the selected reference cell is measured (step 510) and is checked within a target range and a determination is made if the VCCR level on the RWL is to be trimmed up or down. For example, the target range can be determined as follows: (25−Y)μA<$I_{ref}$<(25+Y) μA—where Y can be appropriate tolerances and set according to optimal read characteristics. Thus, if $I_{ref}$>(25+Y) μA then the VCCR level on the RWL is trimmed or adjusted down and if $I_{ref}$<(25−Y) then the VCCR level on the WL is trimmed or adjusted. The trimming process can use the appropriate voltage levels from the appropriate power supply pins and adjusted accordingly. This process is repeated until the $I_{ref}$ falls within the target range. At step 512, if another reference cell requires trimming, the process continues to step 506.

Figure 6A:
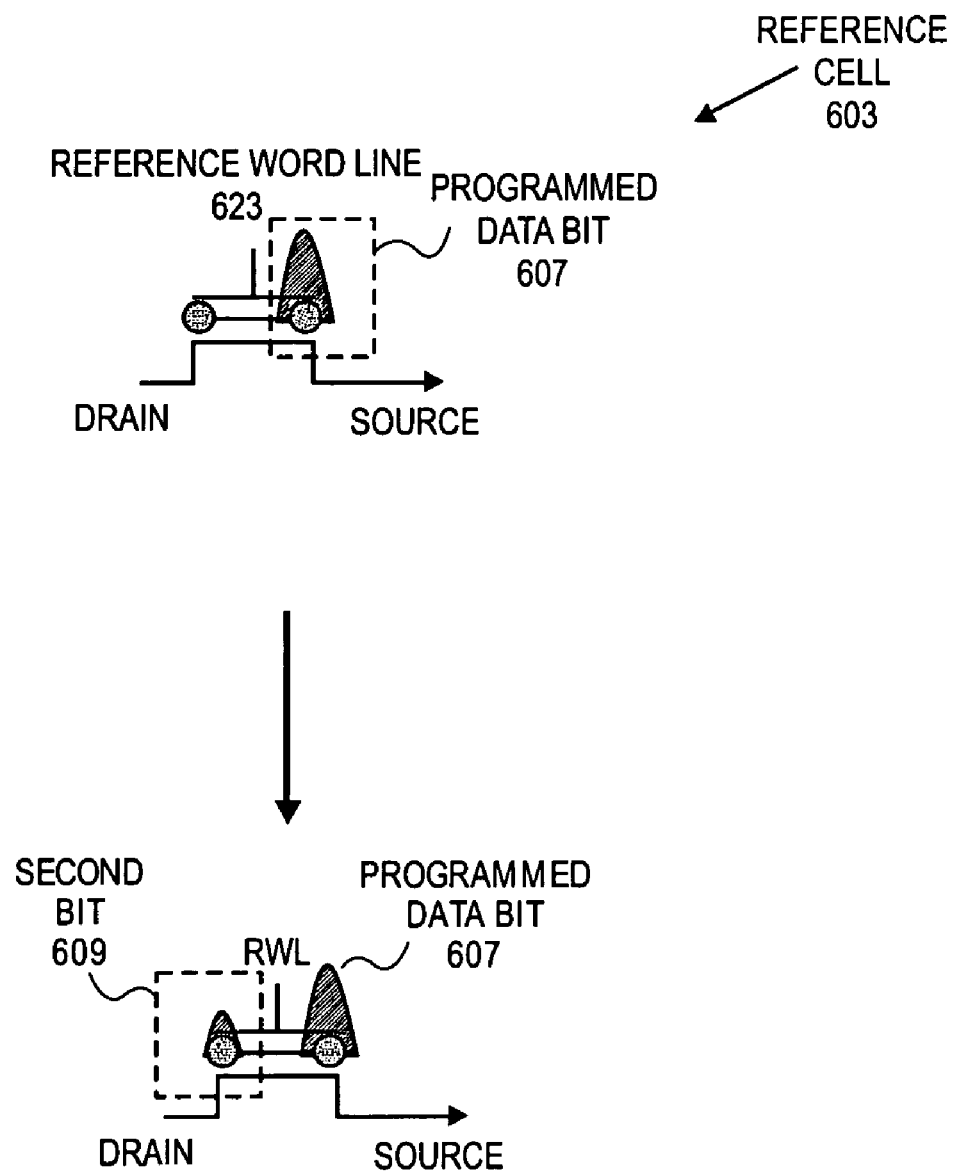
FIG. 6A illustrates the read disturb and second bit effect for a programmed reference cell.

FIG. 6A illustrates the read disturb and second bit effect for a programmed reference cell. As shown, reference cell 603 includes a programmed reference bit 607. For the example of a NROM memory device, the second bit 609 can have effects on the programmed reference cell 603. For instance, during a read operation, the operation bias condition for a neighboring bit (second bit 609) to the programmed reference reference bit 607 is similar with the program operation. Consequently, after numerous read/verify operations, the neighboring second bit 609 threshold voltage can increase due to trapped electrons, which is referred to as "read disturb." Furthermore, the increase of the threshold voltage for the neighboring second bit 609 can cause the reference current to degrade during a read reference. This is referred to as "second-bit effect." Therefore, the reference current from reference cell 603 can decrease gradually after a period of time when performing read/verify operations thereby decreasing the reliability of the memory device.

Figure 6B:
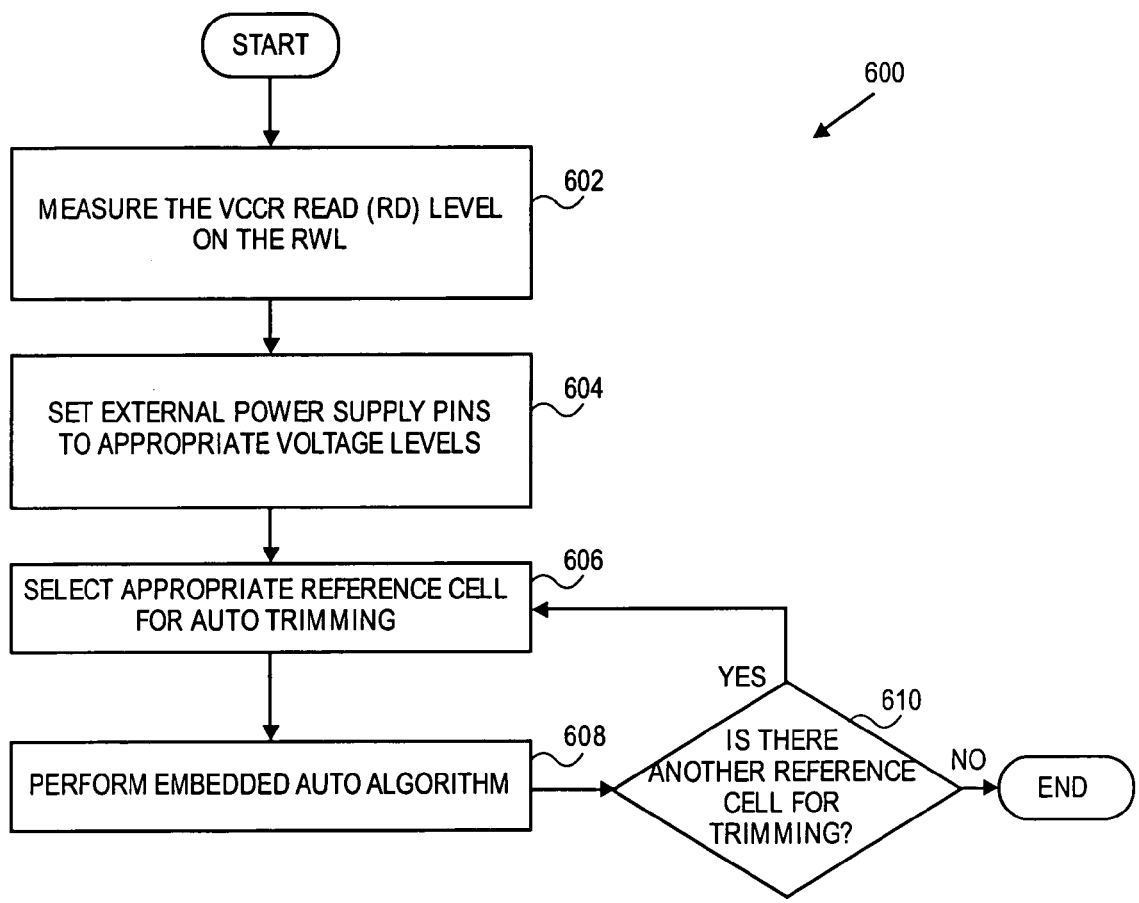
FIG. 6B illustrates an exemplary flow diagram of a reference current trimming algorithm to address the read disturb effects described in FIG. 6A.
Figure 7:
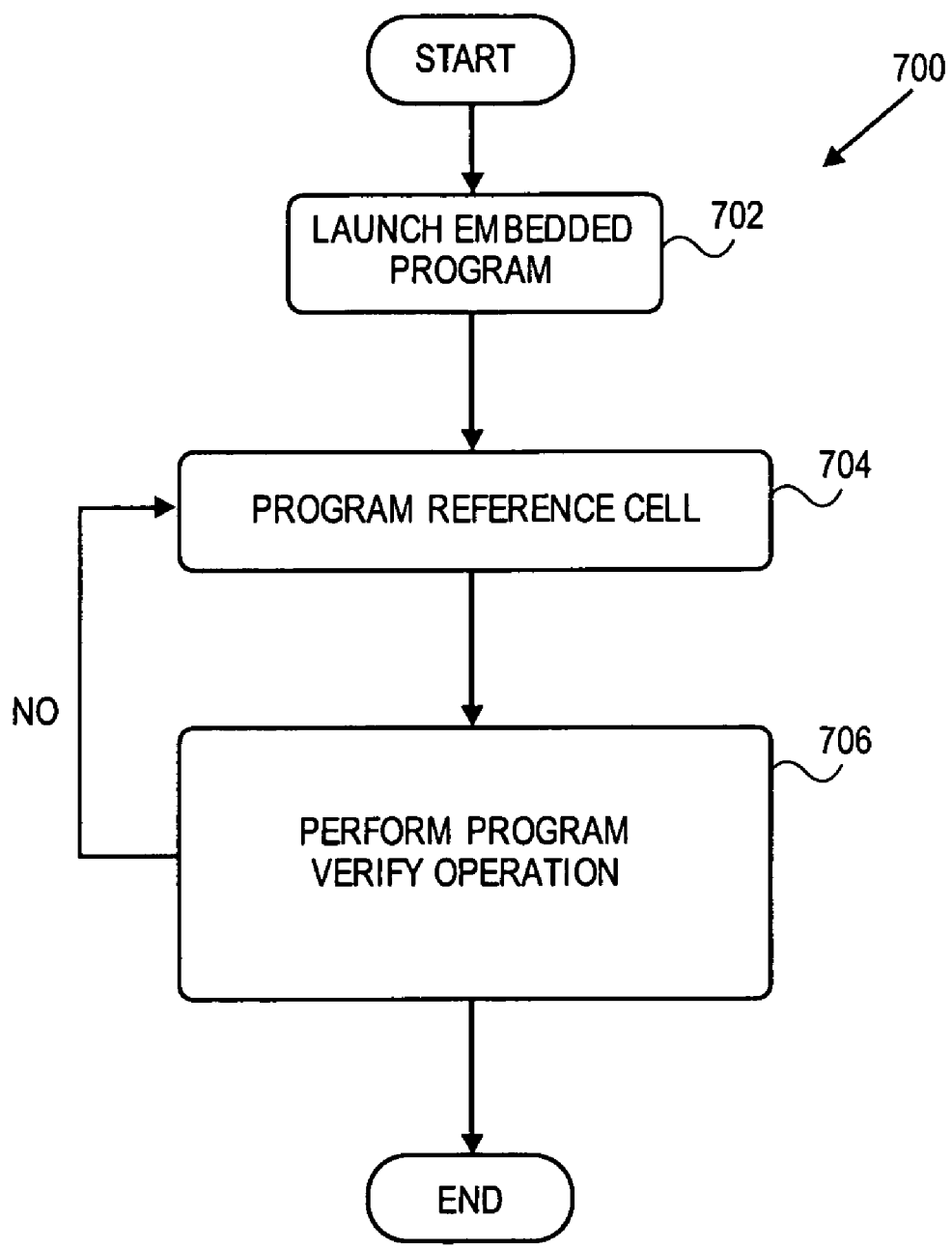
FIG. 7 illustrates an exemplary flow diagram of an embedded auto-algorithm for programming a reference bit and its second bit.

FIG. 6B illustrates an exemplary flow diagram 600 of a reference current trimming algorithm to address the read disturb effects described in FIG. 6A. The flow diagram 600 is similar to the flow diagram 500 of FIG. 5. Initially, the VCCR read (RD) level on the RWL is measured (step 602). Next, the external power supply pins are then set to appropriate voltage levels (step 604). For example, the EXT_PWR1 power supply pin can be set such that EXT_PWR1=VCCR−NM, wherein NM is neighbor bit program margin voltage and can be dependent on experimental data to minimize the read disturb effects. The EXT_PWR2 power supply pin can be set to a of 6V to 7.5V and the range can vary according to device characteristics. The appropriate reference cell is then selected for auto trimming (step 606). The selected reference cell is selected such that the neighboring bit, e.g., second bit 609 in FIG. 6A will be programmed in the subsequent step. The embedded auto algorithm of FIG. 7 is then performed to program the second bit or neighboring bit (step 608. At step 610, if another reference cell requires trimming, the process continues to step 606. In certain examples, the method of FIG. 6A can be performed first to address the read disturb effect of a neighboring bit and then the method of FIG. 5 is performed to program the reference cell and the reference cell current trimming operation.

FIG. 7 illustrates an exemplary flow diagram 700 of an embedded auto-algorithm for programming a reference bit. Initially, the embedded program is launched (step 702). The memory device can be configured to be hard wired or include code instructions that are processed to implement the method of FIG. 7, as well as the methods of FIGS. 5 and 6A. In certain examples, the embedded program is only used for the reference current trimming operation. Next, the reference cell is programmed (step 704). The reference cell can be programmed in one shot. For example, the RWL of the selected reference cell can be connected to EXT_PWR2 power supply pin and the EXT_PWR2 level can be controlled to optimize the reference cell program speed and stability. A program verify operation is then performed (step 706). In this step, the main memory array can be read and checked if all memory cells read a logic "1" pass. During this verify operation, the array of WLs can be connected to the EXT-PWR1. In this manner, the EXT-PWR1 level can be adjusted to control the cycle margin CM level. In certain examples, the "main memory array" can refer to the "whole memory array," "a segment of memory array" or "specially memory array," as long as this "main memory array" can be represented by the initial threshold voltage $V_T$-characteristic of "whole memory array." After program verification, the embedded program is completed and can return to source program or method, e.g., return back to the method described in FIG. 5 or 6B.

Figure 8:
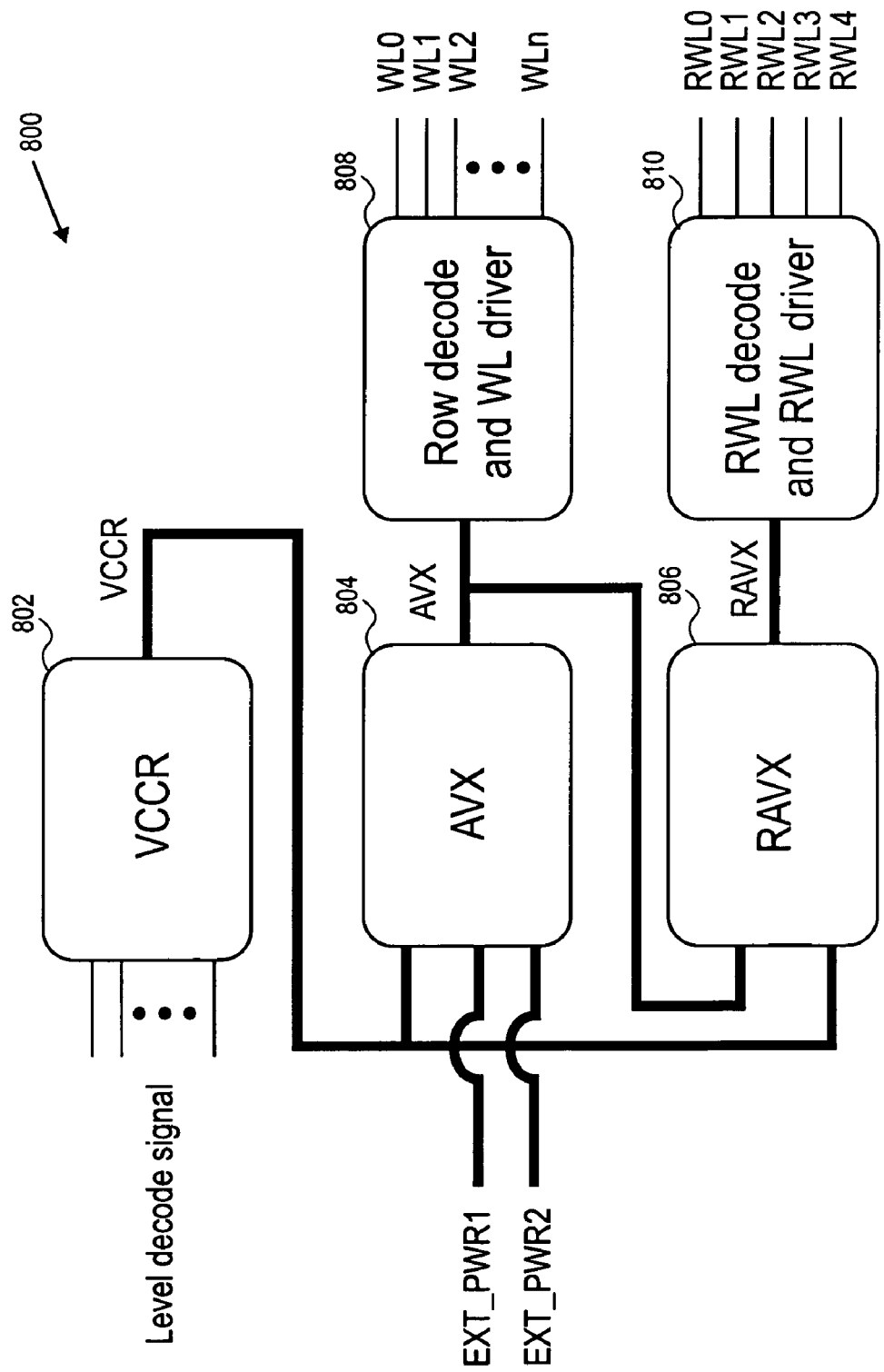
FIG. 8 illustrates one example of a WL/RWL voltage control system diagram.

FIG. 8 illustrates one example of a WL/RWL voltage control system diagram 800. As shown, the "level decode signals" contain the VCCR adjusting information and instructions for the VCCR voltage source block 802. These decode signals can also provide read/program and verify/erase or other verify logic information to the VCCR voltage source block 802. The VCCR voltage source block 802 provides voltage levels to the AVX and RAVX voltage generation blocks 804 and 806. The AVX block 804 receives power supply pins EXT_PWR1 and EXT_PWR2 and output the AVX voltage levels to row decode and WL drive block 808. Block 808 outputs voltage levels on the word lines WL0 to WLn. The RAVX voltage generation block 806 outputs the RAVX voltage to the RWL decode and RWL drive block 810. Block 810 outputs voltage levels on the reference word lines RWL0 to RWL4—if implementing the example of FIG. 4A.

The following table illustrates exemplary values for the VCCR, AVX and RAVX blocks 802, 804, and 806 during different modes of operation.

| Read Modes | VCCR | AVX | RAVX |
|---|---|---|---|
| User Read | VCCR (RD) | VCCR (RD) | VCCR (RD) |
| Program Verify | VCCR (PV) | VCCR (PV) | VCCR (PV) |
| Erase Verify | VCCR (EV) | VCCR (EV) | VCCR (EV) |
| Other Read/Verify Mode | VCCR (Adjustable) | VCCR (Adjustable) | VCCR (Adjustable) |
| Program Phase During Reference Cell Programming | — | EXT_PWR2 | AVX (EXT_PWR2) |
| Verify Phase During Reference Cell Programming | VCCR | EXT_PWR1 | VCCR |

Thus, a memory device and methods using improved reference cell trimming algorithm for accurate read operation window control have been described. In the foregoing specification, the invention has been described with reference to specific examples and embodiments. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of operating a memory device including a memory cell and a reference cell, comprising:
   measuring a reference current of the reference cell; and
   trimming a word line voltage coupled to the reference cell if the measured reference current falls outside of a target range, the trimmed word line voltage being applied to the reference cell during a normal read mode operation.

2. The method of claim 1, further comprising:
   measuring the word line voltage coupled to the reference cell before the step of measuring the reference current of the reference cell.

3. The method of claim 1, wherein the word line voltage coupled to the reference cell is trimmed down if the measured reference current exceeds an upper limit of the target range.

4. The method of claim 1, wherein the word line voltage coupled to the reference cell is trimmed up if the measured reference current is less than a lower limit of the target range.

* * * * *